US009105560B2

(12) United States Patent
Roberts et al.

(10) Patent No.: US 9,105,560 B2
(45) Date of Patent: Aug. 11, 2015

(54) DEVICES AND SYSTEMS FOR POWER CONVERSION CIRCUITS (71) Applicant: GAN SYSTEMS INC., Ottawa (CA)

(72) Inventors: John Roberts, Ottawa (CA); Greg Klowak, Ottawa (CA)

(73) Assignee: GaN Systems Inc., Ottawa, Ontario (CA)

(*) Notice: Subject to any disclaimer, the term of this patent is extended or adjusted under 35 U.S.C. 154(b) by 0 days.

(21) Appl. No.: 14/105,569

(22) Filed: Dec. 13, 2013

(65) Prior Publication Data

US 2014/0175454 A1 Jun. 26, 2014

Related U.S. Application Data (60) Provisional application No. 61/740,821, filed on Dec. 21, 2012, provisional application No. 61/740,825, filed on Dec. 21, 2012.

(51) Int. Cl.
*H01L 25/18* (2006.01)
*H01L 23/495* (2006.01)
(Continued)

(52) U.S. Cl.
CPC .......... *H01L 25/18* (2013.01); *H01L 23/49524* (2013.01); *H01L 23/49562* (2013.01); *H01L 23/49575* (2013.01); *H01L 24/06* (2013.01); *H01F 19/08* (2013.01); *H01L 23/49548* (2013.01); *H01L 23/645* (2013.01); *H01L 24/05* (2013.01); *H01L 24/13* (2013.01); *H01L 24/16* (2013.01); *H01L 24/32* (2013.01); *H01L 24/48* (2013.01); *H01L 24/49* (2013.01); *H01L 2224/0401* (2013.01); *H01L 2224/04042* (2013.01); *H01L 2224/0557* (2013.01); *H01L 2224/05554* (2013.01); *H01L 2224/05555* (2013.01); *H01L 2224/06051* (2013.01); *H01L 2224/06131* (2013.01); *H01L 2224/06181* (2013.01); *H01L 2224/13147* (2013.01); *H01L 2224/16145* (2013.01); *H01L 2224/32245* (2013.01); *H01L 2224/48137* (2013.01); *H01L 2224/48195* (2013.01);
(Continued)

(58) Field of Classification Search
CPC ...................................................... H01L 25/18
USPC ............................................................. 257/76
See application file for complete search history.

(56) References Cited

U.S. PATENT DOCUMENTS

2009/0039869 A1* 2/2009 Williams .................. 324/123 R
2010/0199875 A1* 8/2010 Weihrauch ..................... 102/492
2012/0199875 A1* 8/2012 Bhalla et al. .................. 257/134

*Primary Examiner* — Marc Armand
(74) *Attorney, Agent, or Firm* — Miltons IP/p.i.

(57) ABSTRACT

Devices and systems comprising driver circuits are disclosed for MOSFET driven, normally-on gallium nitride (GaN) power transistors. Preferably, a low power, high speed CMOS driver circuit with an integrated low voltage, lateral MOSFET driver is series coupled, in a hybrid cascode arrangement to a high voltage GaN HEMT, for improved control of noise and voltage transients. Co-packaging of a GaN transistor die and a CMOS driver die using island topology contacts, through substrate vias, and a flip-chip, stacked configuration provides interconnections with low inductance and resistance, and provides effective thermal management. Co-packaging of a CMOS input interface circuit with the CMOS driver and GaN transistor allows for a compact, integrated CMOS driver with enhanced functionality including shut-down and start-up conditioning for safer operation, particularly for high voltage and high current switching. Preferred embodiments also provide isolated, self-powered, high speed driver devices, with reduced input losses.

17 Claims, 8 Drawing Sheets

(51) Int. Cl.
  *H01F 19/08* (2006.01)
  *H01L 23/64* (2006.01)
  *H01L 23/00* (2006.01)
(52) U.S. Cl.
  CPC ............. *H01L 2224/48247* (2013.01); *H01L 2224/49175* (2013.01); *H01L 2224/73253* (2013.01); *H01L 2224/73265* (2013.01); *H01L 2924/1033* (2013.01); *H01L 2924/10253* (2013.01); *H01L 2924/10272* (2013.01); *H01L 2924/1305* (2013.01); *H01L 2924/1306* (2013.01); *H01L 2924/13064* (2013.01); *H01L 2924/13091* (2013.01); *H01L 2924/19104* (2013.01); *H01L 2924/30107* (2013.01)

DEVICES AND SYSTEMS FOR POWER CONVERSION CIRCUITS

CROSS-REFERENCE TO RELATED APPLICATION(S)

This application claims priority from U.S. provisional patent application No. 61/740,821, filed 21 Dec. 2012, entitled "Devices and Systems for Power Conversion Circuits" and from U.S. Provisional patent application No. 61/740,825, filed 21 Dec. 2012, entitled "Devices and Systems comprising Drivers for Power Conversion Circuits", filed 21 Dec. 2012; both applications are incorporated herein by reference in their entirety.

TECHNICAL FIELD

This invention relates to devices and systems for electronic power conversion circuits, and more particularly relates to devices and systems comprising driver circuits for high frequency, switched mode, power conversion circuits, using high performance power transistors, such as, gallium nitride high electron mobility transistors (GaN HEMTs).

BACKGROUND ART

Semiconductor devices based on gallium nitride (GaN) technology offer significant advantages over silicon technology for power electronic systems. GaN and its alloys, such as aluminum gallium nitride (AlGaN), are direct, wide band gap semiconductor materials, which have applications for microelectronic devices, including diodes and transistors for microwave and power switching circuits, as well as optoelectronics.

For power devices, GaN offers high dielectric strength, high operating temperature, high current density, high speed switching and low on-resistance. Compared to silicon, GaN has ten times the electrical breakdown strength, three times the band gap, and exceptional carrier mobility. These properties enable transistors to be produced with a on-resistance lower than attainable with silicon technology, even better than a mechanical relay contact, and allows for diodes providing a near-zero forward voltage drop. These features, together with inherently negligible charge storage, permit the design of power switching circuits with higher efficiency, smaller size and lower heat losses.

For example, as disclosed in copending PCT International patent application no. PCT/CA2012/000080 entitled "Gallium nitride power devices using island topography" (and related applications, having common ownership and inventorship with this application), GaN transistors with ultra-low on-resistance can be produced using Island Topography™. This topology provides a compact structure with a gate width double that of a conventional multi-finger design of a similar device size, with superior current handling per unit area. A breakdown voltage exceeding 1200V can be achieved.

GaN power transistors for power conversion circuits for high voltage (HV) applications, e.g. 600/650V, are typically normally-on (depletion mode) transistors. These transistors are usually driven by a series connected, discrete, power MOSFET device, i.e. in a cascode configuration, to provide normally-off operation (see FIG. 1). Conventionally, the hybrid cascode arrangement is provided with a separate, high power, high speed driver circuit, having a separate isolated power supply.

This type of hybrid cascode arrangement can provide a positive threshold voltage and further enhancement of the high Figure of Merit (FOM) of a high voltage GaN transistor. However, issues caused by transient voltages and heat dissipation can detract from performance and these issues also create challenges for the design of the driver circuit. The overall performance of hybrid cascode arrangements using existing driver circuits falls short of the potential capabilities of an individual GaN transistor.

The GaN transistor may be required, for example, to provide <20 ns switching time and more than 30 A current switching capability. Any significant series inductance at the MOSFET source or at the common node will provide unwanted L di/dt transients which can be as large as the threshold voltage of the devices, thus causing unwanted switching. It will be appreciated that in operation of an electronic power switching system that is capable of switching, for example, 30 Amps at 1000V, i.e. 30,000 Watts, safe operation may be compromised by any unwanted switching caused by transients or noise that exceeds the threshold voltage of the device.

Additionally, series resistance in the source connection results in debiasing which produces an apparent increase in the on-resistance. Thus, in conventional systems, the driver MOSFET is typically a discrete, oversized driver MOSFET that is rated to withstand ten times the static voltage stress.

To implement the series cascode connection of the two transistors and achieve high speed with low losses, the GaN transistor and a discrete vertical MOSFET are co-packaged using multiple wire bonded connections. Wire bonding is expensive, area consuming, and cumbersome. Additionally, the wire bonded interconnects represent significant inductance that contributes to high frequency switching transients and unnecessary power loss, particularly for switching speeds in the order of 100V/ns.

To reduce the inductance of the connections between the GaN transistor and the MOSFET, the two transistors are physically arranged and packaged in close proximity, to reduce interconnect length. This arrangement then presents problems for thermal management.

GaN transistors that can switch, for example, 24 A (1200 V) and 47 A (650 V) may have die sizes as small as 2×2 mm Calculations show these die, when packaged, can have a thermal resistance of greater than 2° C./W. For example, it is estimated that, for an on-resistance of 80 mΩ, the ohmic power dissipation would be 32 Watts if the device were required to sink 20 Amps The thermal resistance in total for the combination of the device, package and heat sink could exceed 5° C./W, so that the temperature increase from the GaN device dissipation alone could exceed 150° C. The additional heat dissipation of the MOSFET, assuming a 20 mΩ device is used, would be 8 Watts. With the total structure dissipating 40 Watts, the temperature within the package could exceed the safe operating limits of the MOSFET, typically 175° C., if there is insufficient heat dissipation.

Thus, conventional cascode arrangements of a GaN power transistor and a discrete driver MOSFET require complex and costly driver circuitry to manage issues with transient voltages and packaging with significant thermal dissipation capability to maintain acceptable operating temperatures.

Improvements or alternative solutions are needed to address thermal management issues, to address issues with series inductance and resistance, reduce or manage unwanted noise and voltage transients, and enable lower cost and more compact systems and devices for electronic power conversion circuits, particularly those using hybrid cascode arrangements of a normally-on GaN power transistor and a driver MOSFET.

The present invention seeks to overcome, or mitigate, one or more of the above mentioned disadvantages or limitations of these known systems and devices for electronic power conversion circuits, or at least provide an alternative.

SUMMARY OF INVENTION

Aspects of the invention provide systems and devices for power conversion circuits using high voltage power transistors, including systems and devices comprising a cascode arrangement of a normally-on depletion mode high voltage power transistor, driven by a normally-off driver FET, and a driver circuit providing monitoring and control functions for control of noise and transients.

One aspect of the invention provides a system comprising: a cascode arrangement of a normally-on depletion mode high voltage power transistor driven by a normally-off driver FET, wherein: the power transistor is fabricated on a first substrate die; and the driver FET is fabricated on a second substrate die; the first substrate die comprising an arrangement of a plurality of front-side source and gate contacts for the power transistor; and the second substrate die comprising a corresponding arrangement of a plurality of front-side drain and gate contacts for the driver FET; the first and second substrate die being stacked, in a flip-chip configuration, with the respective front-side contacts of each die being directly interconnected by a plurality of conductive interconnects connecting the power transistor and driver FET in cascode configuration.

Preferably the second substrate die further comprises a driver circuit and the driver FET is integrated with the driver circuit. For example, the power transistor comprises a GaN FET and the driver FET comprises a driver MOSFET, and the second substrate comprises a CMOS die comprising a CMOS driver circuit and an integrated driver MOSFET.

Another aspect of the invention provides a system comprising: a cascode arrangement of a normally-on depletion mode high voltage GaN FET driven by a normally-off driver MOSFET, and a driver circuit; wherein the GaN FET is fabricated on a first substrate die; and the driver circuit comprises a CMOS driver circuit fabricated on a second substrate die, the driver MOSFET being integrated with the driver circuit; the first substrate die comprising an arrangement of a plurality of front-side source and gate contacts for the GaN FET; and the second substrate die comprising a corresponding arrangement of a plurality of front-side drain and gate contacts for the driver MOSFET; the first and second substrate die being stacked, in a flip-chip configuration, with the respective front-side contacts of each die being directly interconnected by a plurality of conductive interconnects connecting the power transistor and driver FET in cascode configuration.

The first substrate die preferably comprises a CMOS die comprising a plurality of Through Silicon Vias (TSV) connecting the source of the driver MOSFET to a back-side source electrode of the CMOS die, and wherein drain and gate contacts of the driver MOSFET are provided by said arrangement of a plurality of front-side contact areas of the CMOS die.

The second substrate die (GaN die) preferably comprises a plurality of Through Substrate Vias (TSV) connecting the drain of the GaN FET to a back-side drain electrode of the GaN die, and wherein source and gate contacts are provided by said arrangement of a plurality of front-side contacts of the GaN die.

Beneficially, the respective arrangements of front-side contacts areas of the CMOS die and the GaN die are matched to provide for direct interconnection of respective contact areas by conductive posts, for example, copper posts. Alternatively, gold may be used, or other suitable conductive interconnect material.

For example, the GaN FET may comprise a normally-on GaN HEMT and the driver MOSFET may comprise a normally-off N-channel lateral MOSFET. Preferably, the GaN FET is fabricated comprising island topology, and correspondingly the driver MOSFET is fabricated comprising island topology.

Such a system, comprising direct interconnection of the power transistor on a first die, and the driver FET on a second die and co-packaging provides for reduced series inductance and resistance and improved thermal management. These devices and systems have particular application for power conversion circuits using a hybrid cascode arrangement of a high voltage normally-on (depletion mode) GaN power transistor and a low voltage driver MOSFET, such as used in high frequency, switched mode, power conversion circuits, using high performance power transistors, and particularly, gallium nitride high electron mobility transistors (GaN HEMTs). Advantageously, the driver circuit comprises a CMOS integrated circuit and the driver FET comprises a low voltage MOSFET, e.g. a lateral N-channel MOSFET monolithically integrated with the CMOS driver circuit. In alternative embodiments, the driver FET may alternatively be a LV normally-off GAN FET.

Preferably, the CMOS die and the GaN die are stacked, as in a flip-chip configuration, to provide for direct interconnects between the drain of the driver MOSFET and the source of the GaN HEMT and between the source of the driver MOSFET and the gate of the GaN HEMT.

Preferably, the driver MOSFET is fully integrated with the CMOS driver circuit on the same silicon substrate (i.e. "CMOS die"), the source of the driver MOSFET is preferably provided with a very low inductance and low capacitance connection to the source electrode. Beneficially, when the source electrode is a large area source electrode provided on the back-side of the CMOS die, and the driver MOSFET source on the front-side of the substrate is connected by a plurality of through substrate vias or through silicon vias (TSV).

In an embodiment, the GaN die comprises a plurality of through substrate vias (TSV) connecting the drain of the GaN FET to a back-side drain electrode of the GaN die, and source and gate contacts are provided by front-side/on-chip contacts of the GaN die.

Correspondingly, the CMOS die also comprises a plurality of through silicon vias (TSV) connecting the source of the driver MOSFET to a back-side source electrode of the CMOS die, and drain and gate contacts of the driver MOSFET comprise a plurality of front-side contact areas of the CMOS die.

For example, the GaN device may be fabricated on a silicon or silicon carbide substrate, with GaN epitaxial layers (epi-layers) and an interconnect structure using Island Topology™. The CMOS driver MOSFET may be fabricated using a standard CMOS process and an interconnect structure using a similar interconnect topology.

The respective arrangements of front-side/on-chip contacts areas of the CMOS die and the GaN die are matched (i.e. mirror image) to provide for direct interconnection of respective contact areas by conductive interconnects when the two die are stacked in a flip-chip configuration. Advantageously, each respective pair of contact areas of the CMOS die and GaN die is interconnected by a conductive interconnect comprising a low inductance, low resistance interconnect material, e.g. micro-connects comprising metal posts, such as copper. This arrangement for assembly and co-packaging enables a compact and low inductance, low capacitance connection between the CMOS die carrying the CMOS driver circuit and integrated driver MOSFET and the GaN.

The system may further comprise packaging elements for electrical connections and thermal management, such as, a PQFN type package format. The packaging elements may comprise a first lead frame and heat spreader in thermal contact with the back-side, source electrode, of CMOS die and a second lead frame and heat spreader in thermal contact with back-side, drain electrode, of the GaN die. Beneficially, the first and second heat spreaders are configured so that significantly greater than 50%, and preferably >90%, of heat produced by the system is dissipated through the second heat spreader on the back-side of the GaN die, because the GaN die is more thermally resilient. Thus, the temperature of the CMOS driver circuit can be maintained within an acceptable operating temperature range with a smaller second heat spreader thermally coupled to the copper lead frames supplying the CMOS driver circuit.

The respective arrangements of front-side/on-chip contacts areas of the CMOS die and the GaN die are matched to provide for direct electrical interconnection of each respective contact areas by a metal post or similar micro-connect to provide low resistivity, low inductance electrical connections between the two devices. Beneficially, the metal posts further act as compliant spacers between the CMOS die and GaN die. In particular, the metal posts have sufficient height and compliance (ductility) to accommodate differential thermal expansion of the GaN die and CMOS die during operation, e.g., the posts may comprise 140 μm copper posts rather than conventional 50 μm posts, i.e. the height to diameter ratio of >1:1 and preferably greater than 2:1.

Accordingly, embodiments of the invention are disclosed that provide devices and systems comprising an integrated gate driver circuit for a power transistor comprising a cascode arrangement of a normally-on GaN FET and a normally-off driver MOSFET. The driver circuit preferably comprising a low power CMOS driver circuit with an integrated lateral driver MOSFET, for high speed operation.

Also provided is a system comprising an interface circuit on a third substrate die, the interface circuit providing pre-isolation conditioning and isolation for the driver circuit, and the third substrate die co-packaged with the first substrate die comprising GaN FET and second substrate die comprising the CMOS driver circuit and integrated driver MOSFET.

For example, the interface circuit comprises a pulse generator for generating the differential input control signals for the driver circuit and an isolation transformer coupling for coupling the input signals to the driver circuit.

As described in detail in the above referenced U.S. provisional application No. 61/740,825, an integrated CMOS driver circuit provides for more complex control and monitoring of the power transistor. The driver circuit is configured to reduced noise and reduces unwanted voltage transients, using latch and clamp control circuitry based on monitoring Vcc conditions. It provides for power-up and power-down conditioning for safer operation Isolation is preferably provided by an isolation transformer coupling, and an integrated power source is also desirably, eliminating the need for separate isolation and a separate power source.

A further aspect of the invention comprises: a cascode arrangement of a HV normally on GaN FET transistor, the driver MOSFET comprising a low voltage lateral N-channel MOSFET fabricated on a silicon substrate, the GaN FET transistor being fabricated on a first substrate (GaN die) and the driver MOSFET being fabricated on a second substrate (CMOS die); and the CMOS die and the GaN die being stacked in a flip-chip configuration to provide a plurality of direct interconnects between the drain of the driver MOSFET and the source of the GaN HEMT and a plurality of direct interconnects between the source of the driver MOSFET and the gate of the GaN HEMT.

Also provided is a driver for a system comprising a cascode arrangement of a HV normally on GaN transistor and a normally-off N-channel driver MOSFET. The driver MOSFET comprising: a lateral N-channel MOSFET fabricated on a silicon substrate (CMOS die), and comprising an array of a plurality of alternating source and drain regions defined on an active region of the silicon substrate, channel regions extending between the source and drain regions, and an interconnect structure comprising respective source, drain and gate contacts, a plurality of Through Substrate Vias (TSV) connecting the source contacts to a back-side source electrode of the CMOS die, and wherein drain and gate contacts of the driver MOSFET comprise an arrangement of a plurality of front-side contact areas of the CMOS die.

Thus, arrangements are disclosed for co-packaging and interconnection of a hybrid cascode arrangement of a normally-on HV GaN FET and a normally-off driver MOSFET that reduces series inductance and resistance, and provides effective thermal management.

Thus, devices and systems are provided comprising a cascode arrangement of a GaN power transistor and a driver MOSFET integrated with a CMOS driver circuit. Advantageously, embodiments of the system mitigate or circumvent one or more limitations of known devices and systems.

The foregoing and other objects, features, aspects and advantages of the present invention will become more apparent from the following detailed description, taken in conjunction with the accompanying drawings, of preferred embodiments of the invention, which description is by way of example only.

BRIEF DESCRIPTION OF THE DRAWINGS

In the drawings, identical or corresponding elements in the different Figures have the same reference numeral, or corresponding elements have reference numerals incremented by 100 in successive Figures.

DETAILED DESCRIPTION OF PREFERRED EMBODIMENTS

Hybrid Cascode Arrangement

Figure 1A:
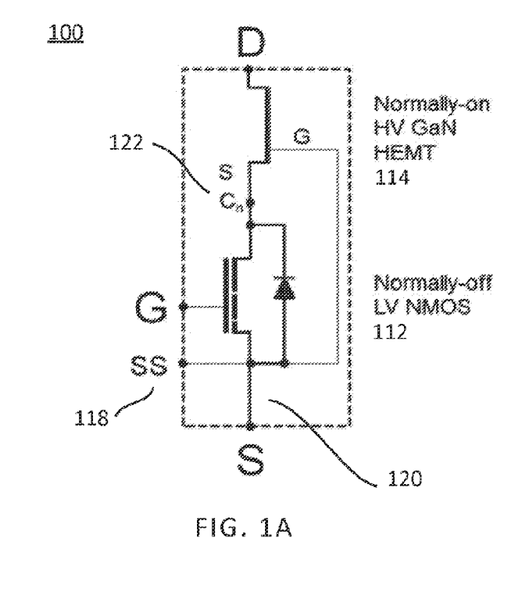
FIG. 1A shows a circuit schematic for a device comprising a cascode arrangement of a normally-on (depletion mode) HV power transistor and a normally-off LV MOSFET driver transistor and FIG. 1B shows the equivalent circuit represented as a single high voltage power transistor.

A circuit 100 comprising a hybrid cascode arrangement of a normally-on depletion mode GaN FET power transistor 114 and a normally-off driver FET 112 is shown schematically in FIG. 1A. The equivalent circuit 102 is shown as a single high voltage transistor in FIG. 1B. In embodiments of the invention described herein, the power transistor comprises a high voltage (HV) normally-on, depletion mode, GaN FET, which may comprise a GaN HEMT (High electron mobility transistor) and the driver FET comprises a normally-off low voltage (LV) NMOS (N-channel) MOSFET.

Figure 1B:
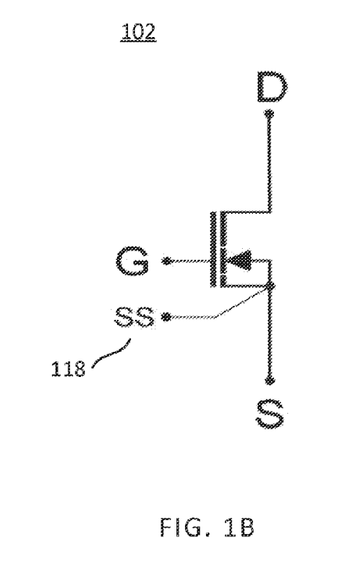

The arrangement shown in FIGS. 1A and 1B may be viewed as a very high power microwave integrated hybrid device. As mentioned above, the GaN power transistor may, for example, be required to provide less than 20 nS switching time and more than 30 A current switching capability. In conventional arrangements using a discrete, single N channel driver FET, such as shown in FIG. 1A, a "Kelvin Source Sense" or Kelvin connection SS is provided to enable an external driver device to more cleanly drive the intrinsic source, free of inductive L di/dt noise generated by the high current fluctuations of the source connection S.

Any significant series inductance at the MOSFET source (S) 120 or at the common node (Cn) 122 will provide unwanted L di/dt transients. Such transients can potentially be as large as the threshold voltage of devices—typically plus 2 V for the MOSFET and minus 3 V for a GaN HEMT or minus 7 V for a GaN MISFET, which would result in unwanted switching. Additionally, series resistance in the source connection 120 results in debiasing which produces an apparent increase of the on-resistance. Thus, it is desirable to provide a driver circuit that provides monitoring and control of noise and transients. Preferably the driver circuit comprises a CMOS driver circuit and the driver MOSFET is integrated with the CMOS driver circuit.

Details of the circuit design of the system, comprising the integrated CMOS die comprising the driver circuit and an integrated driver MOSFET, are disclosed in the above referenced U.S. provisional patent application No. 61/740,825. The following description focusses on the assembly and interconnection of the elements of the system for reduced inductance and resistance, and thermal management.

Arrangements will now be described for interconnection and co-packaging of a system in a stacked die configuration, i.e. a CMOS die 500, comprising a CMOS driver circuit having an integrated driver MOSFET 112, and a die 400 carrying the GaN transistor 114, which provides for reduced series inductance and resistance, and effective thermal management.

Figure 1C:
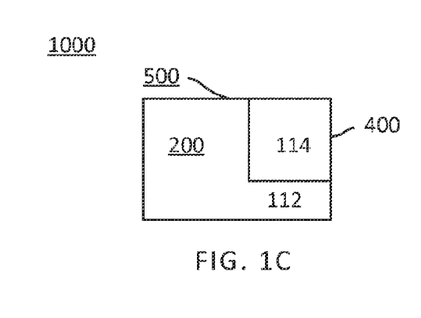
FIG. 1C shows a simplified block diagram of a system according to a first embodiment of the invention comprising a cascode arrangement of a normally-on (depletion mode) HV GaN power transistor and a normally-off LV MOSFET driver transistor, comprising an assembly of a first die comprising the GaN power transistor (GaN die) and a second die (CMOS driver die) comprising a CMOS driver circuit with an integrated driver MOSFET.

FIG. 1C shows a simplified block diagram of a system 1000 according to a first embodiment of the present invention comprising a cascode arrangement of a normally-on (depletion mode) HV GaN power transistor 114 and a normally-off LV MOSFET driver 112 transistor, comprising an assembly of a first die (GaN die) 400, comprising the GaN power transistor 114 and a second die (CMOS driver die) 500, comprising a CMOS driver circuit 200 with an integrated driver MOSFET 112.

Figure 1D:
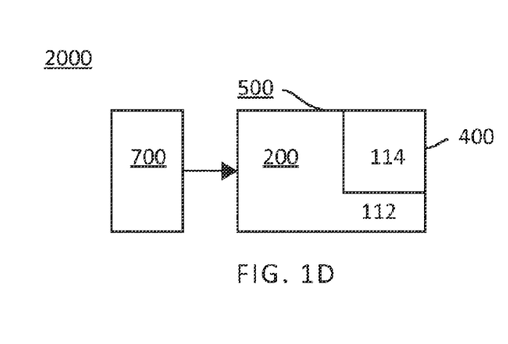
FIG. 1D shows a simplified block diagram of a system according to a second embodiment comprising a cascode arrangement of a normally-on (depletion mode) HV GaN power transistor and a normally-off LV MOSFET driver transistor, comprising an assembly of a first die comprising the GaN power transistor (GaN die); a second die (CMOS driver die) comprising a CMOS driver circuit with an integrated driver MOSFET; and a third die comprising an interface circuit.
Figure 2:
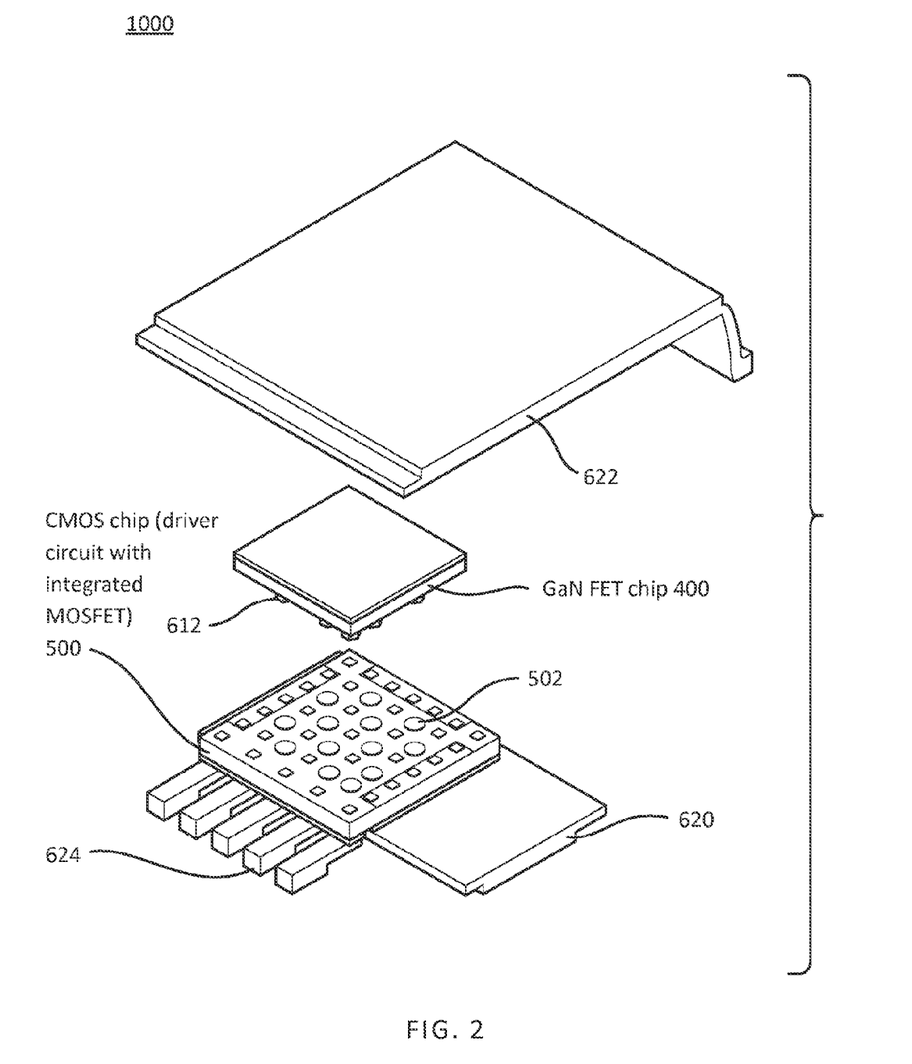
FIG. 2 shows an exploded view of elements of a system according to a first embodiment of the invention, comprising an assembly of a GaN die comprising a normally-on GaN HEMT, a CMOS die comprising an integrated driver MOSFET, and packaging elements.

FIG. 1D shows a simplified block diagram of a system according to a second embodiment comprising a cascode arrangement of a normally-on (depletion mode) HV GaN power transistor and a normally-off LV MOSFET driver transistor, comprising an assembly of a first die comprising the GaN power transistor (GaN die); a second die (CMOS driver die) comprising a CMOS driver circuit with an integrated driver MOSFET; and a third die comprising an interface circuit for pre-isolation conditioning and isolation. FIG. 2 shows an exploded view of elements of the system 1000 of the first embodiment comprising the stacked die configuration of the CMOS die 500, comprising a CMOS driver circuit having an integrated N channel driver MOSFET, and the die 400 carrying the GaN FET transistor. The CMOS die 500 comprises an arrangement of a plurality of front-side contacts 502 and the GaN die 400 comprises a corresponding arrangement of plurality of front-side contacts, each connected to a copper post 612. The two die are stacked in flip-chip configuration to provide multiple interconnects, through the copper posts 612, for direct cascode interconnection of the GaN FET and the driver MOSFET. The copper posts provide for interconnection of the devices with reduced series inductance and resistance. Also shown are elements of the packaging, in the form of a Power Quad Flat No Lead (PQFN) type package, which includes large area upper and lower copper lead frames 620, and 622, with integral heat spreaders, which provide for electrical connections and thermal management. The CMOS die 500 is mounted on the lower lead frame and heat spreader 620, with electrical contacts 624. The upper lead frame and heat spreader 622 is placed over the GaN die 400. Each lead frame 620 and 622 comprises integral heat spreader for thermal management.

In this embodiment, the driver MOSFET 112 preferably comprises a large N-channel lateral MOSFET device that can be fabricated using a standard CMOS process used for fabrication of the driver circuit. Thus, both the CMOS driver circuit and driver MOSFET can be fully integrated on the same semiconductor substrate, i.e. a silicon substrate CMOS die 500. The contact arrangement for the CMOS die 500 is represented schematically in FIGS. 3A and 3B, and will be described in detail below.

The GaN HEMT is fabricated by a GaN epitaxial process on a silicon or silicon carbide substrate GaN die 400. The contact arrangement for the GaN die 400 is represented schematically in FIGS. 4A and 4B, and also described in detail below.

The CMOS die 500 and the GaN die 400 carrying the GaN HEMT are then interconnected, with the driver MOSFET and GaN transistor in cascode configuration to directly drive the source 116 of the GaN transistor 114. In fabricating the CMOS chip comprising a driver circuit comprising an integrated driver MOSFET, or a discrete driver MOSFET, it is also desirable to provide a low inductance source electrode and reduce the series inductance and resistance of the cascode arrangement.

As described in the above referenced PCT application PCT/CA2012/000080, the GaN transistor may comprise an Island Topology™ GaN HEMT transistor. Using this topology, the GaN transistor effectively comprises a large number of interconnected transistor elements, i.e. connected in parallel.

GaN FET

The GaN die 400 comprises a semiconductor substrate, e.g. silicon carbide (SiC) or silicon (Si), and epitaxial layers are formed thereon, comprising the GaN layers forming the GaN transistor. The active region comprises a large area array of alternating regions of first and second conductivity types, i.e. islands defining respectively an array of source and drain regions. The source and drain regions are separated by channel regions. The source, drain and gate contacts are interconnected to form a single large transistor with a large gate width capable of carrying a large current per unit area. That is, as shown schematically in FIGS. 3A and 3B, a plurality of source contacts 402 and drain contacts 404 are provided to the source and drain islands. Gate connections are provided over the channel regions and interconnected to a front-side gate contact 408, for connection to the driver MOSFET source. Beneficially, as illustrated schematically in FIG. 3B, which is a cross-sectional view through B-B of FIG. 3A, a plurality of twelve through substrate vias, i.e. Through Silicon Vias (TSV) 404 provide low inductance, low resistance drain connections from the drain islands to a large area back-side drain electrode/contact pad 401. The source contacts 402 are provided on the top side of the GaN die, and comprise conductive balls, bumps or posts, e.g. copper posts 612. In this way current is carried vertically, reducing current flows in the on-chip metallization, allowing larger currents to be switched without electromigration. Moreover, this contact arrangement provides multiple connections to each of the source and the drain to further reduce inductance and resistance.

Driver MOSFET

Beneficially the LV driver MOSFET 112 is fabricated using a standard CMOS process technology. Such a device may then be fully integrated with the driver circuit on a CMOS integrated circuit chip 500. As shown schematically in FIGS. 4A and 4B, the CMOS driver chip 500 comprising the large area N-channel MOSFET, comprises a plurality of front-side/on-chip drain contact pads, using an island topology type of contact arrangement 502, similar to that of the GaN device 400. In this embodiment, the large area driver MOSFET comprises most of the active area of the CMOS die, while the driver circuit 200, represented schematically shown in dotted outline occupies a relatively small area of the CMOS die near the input pads 522.

Figure 4A:
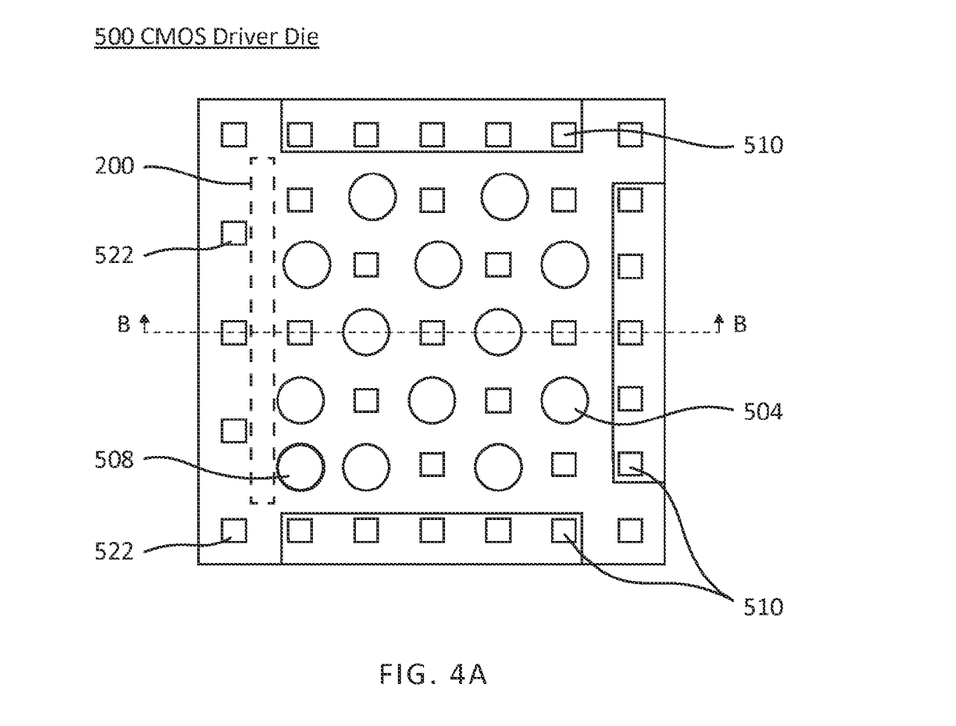
FIG. 4A shows a schematic view of the front-side contact arrangement of the CMOS die comprising the driver circuit and the integrated N-channel driver MOSFET fabricated with island topology.
Figure 4B:
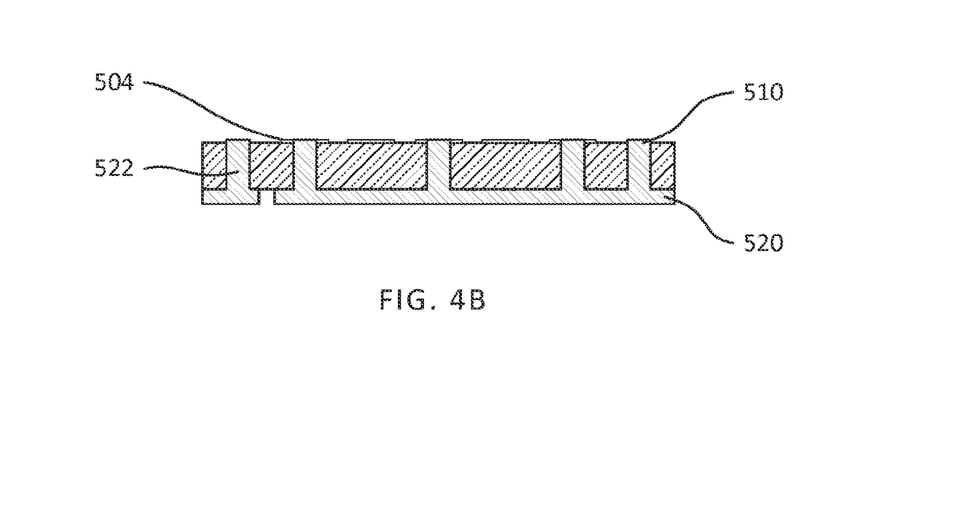
FIG. 4B shows a cross-section through line B-B of FIG. 4A showing the through substrate vias (TSV) providing connections to a back-side source electrode/contact pad.

As shown schematically in FIG. 4B, which is a cross sectional view through B-B in FIG. 4A, a plurality of Through Silicon Vias (TSV) 510 provide low inductance, low resistance connections from source contacts 502 on the front-side of the die, to a large area back-side source electrode/contact pad 520. An arrangement of front-side drain contacts 504 is also provided, for connection with the source contacts 402 of the GaN device in the cascode arrangement. A contact 508 from the MOSFET source is provided for connection to the gate contact 408 of the GaN device. These contact arrangements enable the two die to be directly interconnected in a stacked, flip-chip, configuration, using multiple low inductance and low resistance connections 612, such as copper posts, directly interconnecting the two devices, as illustrated in FIG. 5.

In particular, by using this contact topology for both the GaN transistor and the driver MOSFET and taking advantage of TSV, multiple low inductance and low resistance drain/source interconnects can be provided between the two die to interconnect the GaN transistor and the driver MOSFET in a hybrid cascode arrangement. Additionally the driver MOSFET is provided with a low inductance back-side source connection and the GaN transistor has a low inductance back-side drain connection Thus, a hybrid cascode arrangement can be provided with significantly reduced series resistance and inductance relative to conventional wire bonded interconnect between discrete devices.

Co-Packaging and Thermal Management

Figure 5:
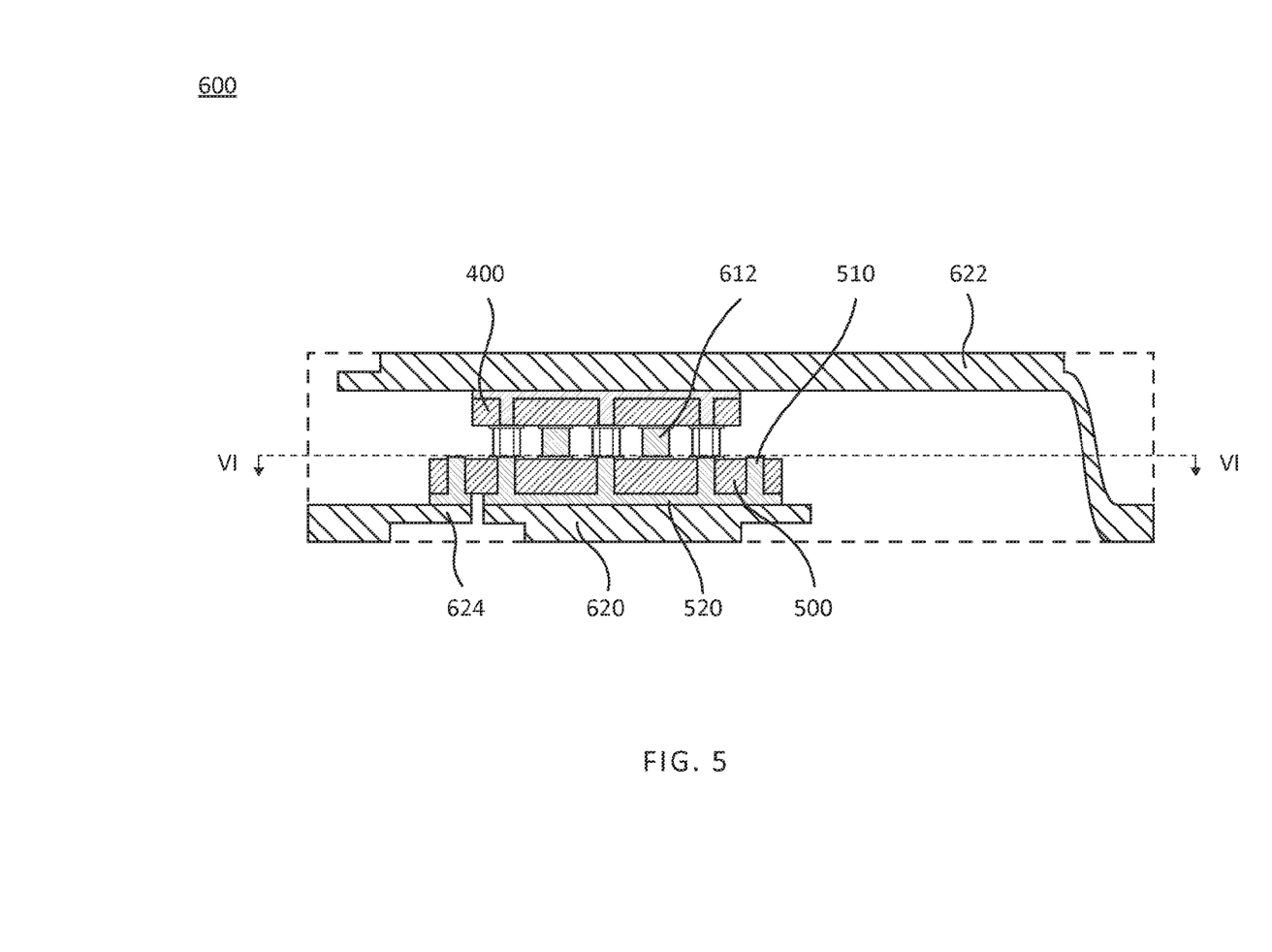
FIG. 5 shows a schematic cross-sectional view of the system of the first embodiment comprising a first substrate (CMOS die) comprising a CMOS driver circuit with an integrated a drive MOSFET, a second substrate (GaN die) comprising a GaN power transistor, co-packaged in an assembly comprising packaging elements providing electrical connections and thermal management.
Figure 6:
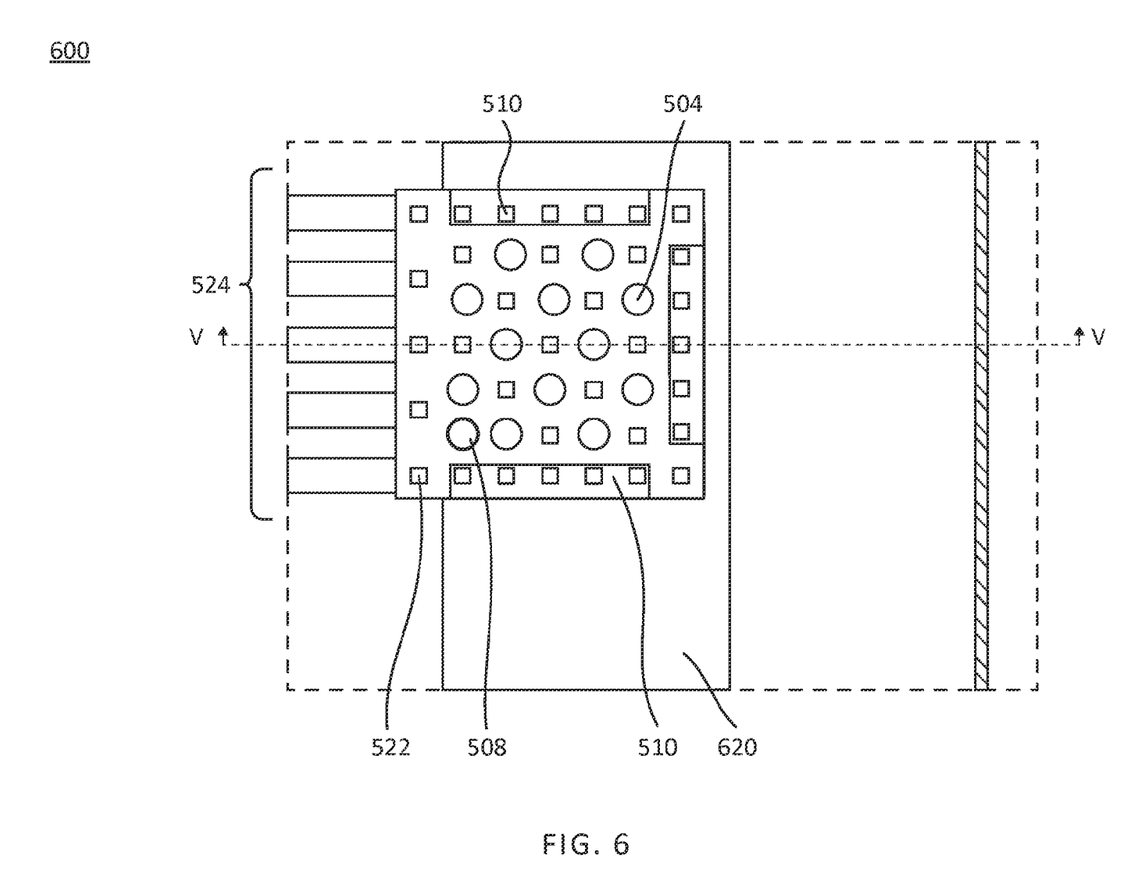
FIG. 6 shows a cross-sectional view through VI-VI of FIG. 5, showing the arrangement of multiple contacts for coupling the GaN power transistor with integrated driver MOSFET of the CMOS die.

FIG. 5 shows a cross-sectional view through an assembled packaging arrangement 600 for the system 1000. For simplicity, dielectric components are not shown and thus the outline of the package body is represented by a dashed line. FIG. 6 shows a cross-sectional view through VI-VI of the package 600 shown in FIG. 5. As shown in FIG. 5, in the arrangement 600 the CMOS die 500, comprising the CMOS driver circuit and integrated driver MOSFET, and the GaN die 400 are interconnected by conductive posts 612, so that the driver MOSFET is series coupled in a hybrid cascode arrangement with a GaN power transistor. The two devices 400 and 500 are assembled and co-packaged to provide electrical connections and thermal management, in the PQFN type package.

The GaN FET die 400 may for example be a 2 mm×2 mm die. The substrate 400 of the GaN die is preferably silicon carbide (SiC). For lower cost fabrication, the substrate may be silicon. The CMOS device driver comprising the large area integrated driver MOSFET is fabricated on a somewhat larger silicon substrate die 500, to accommodate the driver circuitry 200 and the input/output connections e.g. 522 to the input/output pins 624.

As mentioned above, in this embodiment, the CMOS driver circuitry occupies only a small area of the CMOS die. In other embodiments, a larger CMOS die, with a more complex CMOS driver circuit may alternatively be provided.

FIG. 5 shows a schematic cross-sectional view of the packaged system 600 comprising the GaN die 400 and CMOS driver die 500 assembled and packaged in a PQFN type of package, with the GaN die 400 flipped over and stacked on the CMOS driver die 500 to provide for direct interconnection by a plurality of twelve conductive micro-connects in the form of copper posts 612 The CMOS driver die 500 comprising the TSV providing source connections 510 to the large area back-side source contact pad 520 and is supported in thermal contact with a first combined leadframe and heatspreader 620 of the package 600. A second leadframe with a larger heatspreader 622 is provided in thermal contact with the back-side of the GaN die 400. Contact leads 624 of the package are connected, through TSV 522, to the input pads of the CMOS die. Lead frame 622 provides a drain contact to the back side of the GaN FET die.

Figure 3A:
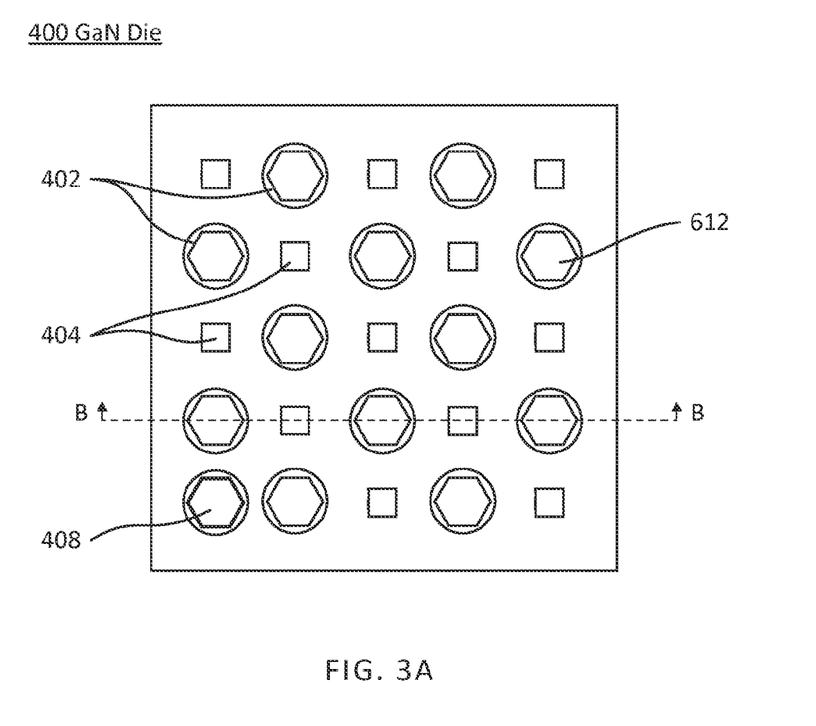
FIG. 3A shows a schematic view of the front-side contact arrangement of the GaN die comprising the GaN HEMT fabricated using island topology.
Figure 3B:
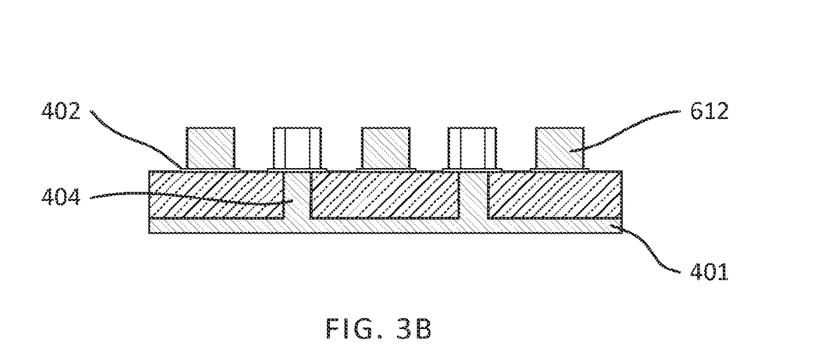
FIG. 3B shows a cross-section through line B-B of FIG. 3A showing the through substrate vias (TSV) providing connections to a back-side drain electrode/contact pad.

Referring to FIG. 6, which shows a plan view through section VII-VII of FIG. 5, the top side of the CMOS die has an arrangement of contacts as shown in FIG. 3A. The twelve drain contacts 504 align to the twelve source contacts 404 of the overlying GaN die 400 and are interconnect by posts 612. Similarly the large area source contact 508 aligns to the gate contact 408 of the overlying GaN die.

Notably, the source 502 of the driver MOSFET is connected by through substrate (silicon) vias (TSV) 510 to a large source electrode 520 on the back-side of the silicon substrate 500. These vias 510 provide the very low resistance and the very low inductance source connection required.

As a result of integration of the drive MOSFET with a low power CMOS driver circuit, it is possible to add monitoring, control and reporting circuitry that provides more complex control functions to drive and protect the GaN switch, i.e. a high voltage GaN HEMT and a low voltage driver MOSFET or alternative arrangement. In particular, it is desirable to reduce or substantially eliminate the effect of noise, or unwanted voltage transients, which could trigger unwanted switching. Design of a self-powered driver circuit which provides improved power conditioning, comprising latch and clamp functionality, based on monitoring of the supply voltage, is detailed in U.S. provisional application No. 61/740,825.

Thermal Management

The assembly of the CMOS die, carrying the driver circuit comprising the integrated driver MOSFET, and the GaN die is preferably packaged in a Power Quad Flat No Lead (PQFN) package. The PQFN lead-frame 620 carries the CMOS die including the large N-channel driver MOSFET. The GaN die 400 is directly connected to the drive MOSFET as described above, and the package comprises elements for thermal management, that beneficially provide for reduced thermal resistance and provide sufficient local thermal mass to absorb the transient switching power peak of the power transistor. Thus the second heatspreader 622 is significantly larger than the first heatspreader 620. Also, the Si or SiC substrate of the GaN die 400 is thinned, i.e. to reduce thermal resistance, and improve heat dissipation, and the packaging arrangement is configured to allow for significantly more than 50% and preferably more than 90%, of the heat flow from the power transistor 114 to be dissipated through the SiC substrate 400 to heat spreader 622. This dual heatspreader arrangement provides sufficient heat dissipation to allow the MOSFET 112 and the CMOS driver circuit to operate well within an acceptable operational temperature range (typically below 175° C.).

In particular, when the GaN transistor is fabricated using GaN Systems Island Topology™, interconnection of the GaN power transistor and the driver MOSFET may be made with a plurality of, e.g. 12, copper posts to minimize inductance of the interconnect between the NMOS drain and the GaN source. In a preferred arrangement, the metal posts further act as compliant spacers between the CMOS die and GaN die. In particular, the metal posts have sufficient height and flexibility (ductility) to accommodate differential thermal expansion of the GaN die and CMOS die during operation, e.g., the posts may comprise 140 µm copper posts rather than conventional 50 µm posts. These copper posts also provide some thermal separation between the driver MOSFET die and the GaN FET die. That is, the posts also act as thermal spacers between the two die.

This structure can be fabricated using custom layouts within design rules of open CMOS technology and open GaN technology from foundry suppliers. A standard CMOS process can readily provide a large area NMOS device with a performance equivalent to a discrete vertically structured low voltage power transistor. For example, for commercially available lateral transistor structures, providing the voltage requirement is limited to 15V, a conventional CMOS process provides performance more than adequate for the task.

Where the driver MOSFET is fully integrated with the driver circuit on the same substrate chip or die, the on chip driver MOSFET source connections implicitly provide for monitoring of the source of the driver MOSFET, and a conventional Kelvin Source Connection is not required.

In the preferred embodiments of the switching system described above, the power transistor comprises a normally-on HV GaN HEMT. The power transistor may alternatively be another type of GaN MISFET.

Figure 7:
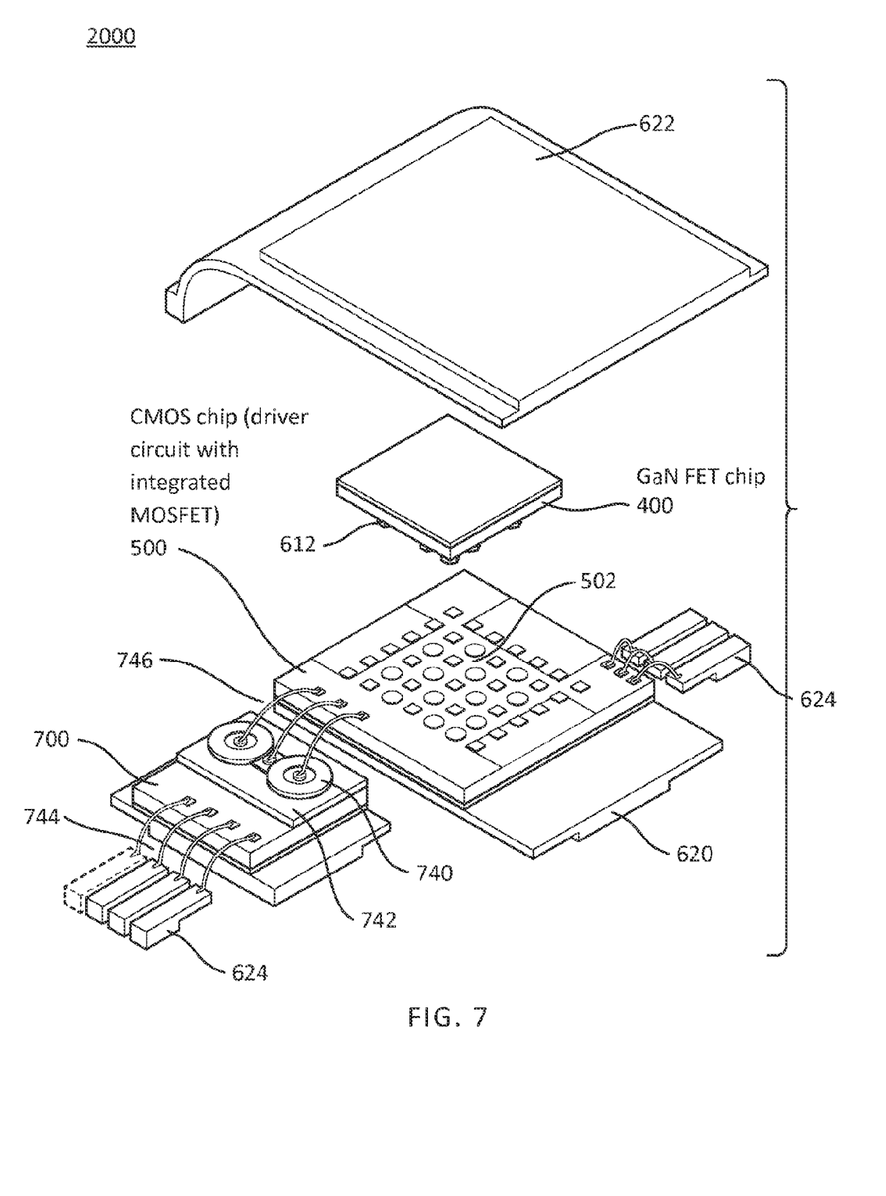
FIG. 7 shows an exploded view of elements of a system according to a second embodiment of the invention, comprising an assembly of a GaN die comprising a normally-on GaN HEMT, a CMOS die comprising an integrated driver MOSFET, another CMOS die comprising an interface circuit and packaging elements.

An exploded view of elements of a system 2000 according to a second embodiment of the invention is shown in FIG. 7.

The system 2000 is similar to the system 1000 shown in FIG. 2, and similarly provides for direct interconnection of the GaN FET die 400 and the CMOS driver die 500, comprising an integrated driver MOSFET. Additionally, it comprises another die, comprising an interface circuit 700, coupled to the inputs of the CMOS driver die 500. Details of the design and operation of interface circuit 700 are also described in detail in the above referenced related copending US provisional patent application. The interface circuit 700 provides pre-isolation conditioning and isolation within the same package. The interface circuit 700 is fabricated as a CMOS integrated circuit comprising a pulse generator and an isolation transformer coupling, for coupling differential input control signals to the CMOS driver chip. The interface circuit may for example comprise a substrate based transformer with a custom or FPGA based pre-isolation conditioning device that is co-packaged with the GaN FET die 400 and the CMOS driver die 500.

For example, as illustrated in FIG. 7, the CMOS die 700 comprising the interface circuit is coupled to inputs 624 of the packaging via wirebonds 744. The interface circuit 700 is coupled via wirebonds 746 from outputs of secondary windings 740 of the isolation transformer coupling 710, to inputs of the CMOS driver die 500. Details of the interconnections are shown in more detail in FIGS. 8A and 8B.

Figure 8A:
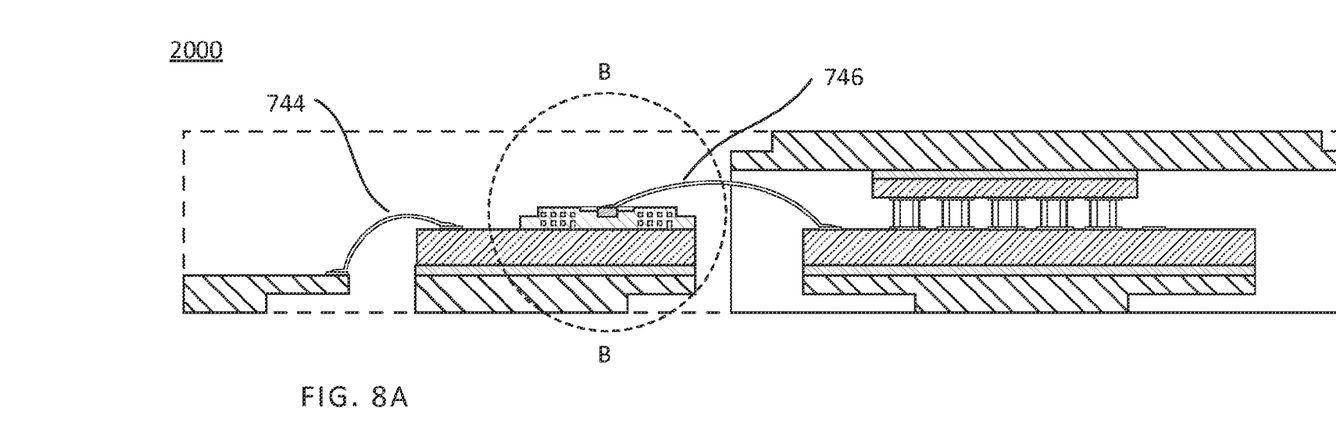
FIG. 8A shows a cross-sectional view of a system comprising the elements of FIG. 7, co-packaged in an assembly comprising packaging elements providing electrical connections and thermal management.
Figure 8B:
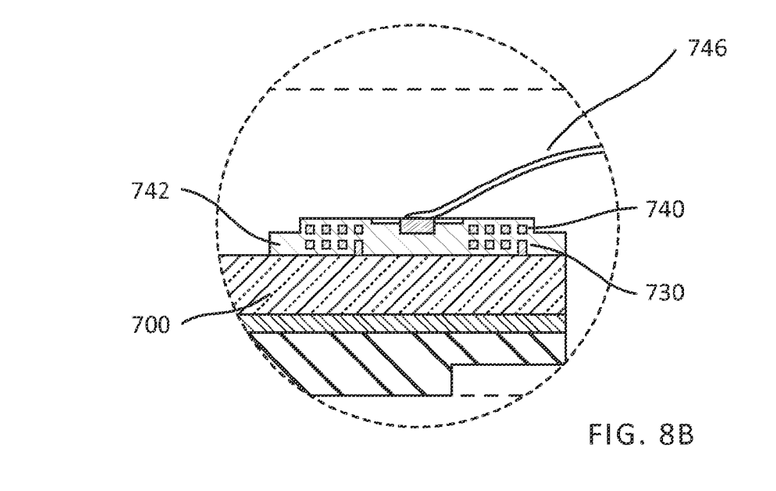
FIG. 8B shows an enlarged cross-sectional view of elements of the transformer coupling shown in FIG. 8A.

As illustrated in FIG. 8A, the elements at the right hand side of the Figure are similar to elements shown in FIG. 5, comprising the CMOS die 500, and the GaN die 400 interconnected by copper posts 612. However, instead of input control signals being coupled directly to input pads of the CMOS die, inputs from pins 624 of the package are coupled to inputs of the interface circuit die 700, e.g. by wirebonds 744, and then transformer coupled to inputs of the CMOS driver die 500, e.g. by wire bonds 746, to provide isolation. The primary spiral winding 730 and secondary spiral winding 740 of the isolation transformer coupling 710 together with isolation layers of the transformer core, e.g. comprising polyimide 742, are indicated in FIG. 8B.

Alternative Embodiments

The intense current interest in GaN transistors has been triggered by their projected performance relative to other power transistors. The best-performing SiC and GaN transistors are depletion mode, i.e. normally-on, types. By comparison, a normally-off (enhancement mode) device provides degraded performance. The cascode approach is therefore a valuable method of providing the required normally-off behavior without compromising performance, and is applicable to both SiC and GaN devices. Beneficially, the smaller gate voltage swing required by GaN HEMT devices, e.g. 5V compared to 15-30V required by some SiC devices, allows standard CMOS processes to be used for the driver circuitry, as disclosed herein. This is a significant advantage.

In particular, integration of a driver MOSFET with CMOS driver circuitry enables more complex monitoring and control. The integrated device driver circuit is preferably low power and high speed, and provides features such as a latch circuitry and clamp circuitry and improved control of voltage transients and noise, to enable safe operation during power-up and power-down transitions.

For example, embodiments of a system and device comprising a drive circuit with integrated drive MOSFET provide isolation, reduced input losses, high speed operation, and enable shut-down and start-up conditioning. Low power operation of the CMOS driver circuit enables the circuit to be powered by an internal integrated power source, using energy harvesting, thus eliminating the need for an isolated external power supply. Embodiments of the system offer one or more advantages for system performance and/or reliability.

Alternatively, a monolithic cascode using a high voltage normally-on GaN HEMT integrated with a low voltage normally-off GaN driver device would potentially offer an exceptional performance. It would also be relatively easy to drive with a small CMOS integrated drive circuit, as described above.

In summary, embodiments described herein provide for systems and devices comprising a cascode arrangement of normally-on high voltage GaN transistors and a normally-off low voltage driver FET. Embodiments are disclosed that provide for multiple interconnections of the GaN FET and the driver MOSFET, in a co-packaging arrangement using direct, low inductance interconnections. The co-packaging arrangement with dual heatspreaders also provides effective thermal management, i.e. provides sufficient local thermal mass to absorb the transient switching power of the GaN device, while thermally protecting the driver MOSFET.

Thus systems according to the embodiments provide one or more of reduced series inductance and resistance; low thermal resistance; separate Kelvin connection(s); effective thermal management.

INDUSTRIAL APPLICABILITY

GaN transistor switches can provide switching speeds of a few nanoseconds and two orders of magnitude improvement in specific on-resistance relative to silicon devices. These advantages provide for improved conversion efficiencies in applications for power systems, such as solar and wind inverters.

Systems and devices comprising driver circuits are disclosed, which are particularly applicable for driving high performance depletion mode GaN transistors, for applications for power conversion circuits. In preferred embodiments, the system comprises a cascode arrangement of a normally on GaN HEMT and a normally off driver MOSFET in which the driver MOSFET is preferably a large area, lateral MOSFET fully integrated with CMOS drive circuitry. The integrated device driver circuit is preferably low power and high speed, and provides features such as a latch circuitry and clamp circuitry and improved control of voltage transients and noise, to enable safe operation during power-up and power-down transitions.

In comparison, conventional GaN cascode designs use off-the-shelf vertical MOSFET power devices as drivers. Such devices cannot be integrated into a standard CMOS process sequence. Thus the conventional approach using discrete vertical MOSFETs does not enable integration with a CMOS driver circuit as described herein.

Advantageously, arrangements are provided for co-packaging a first substrate (die) comprising the CMOS drive circuitry with integrated driver MOSFET and a second substrate (die) comprising the GaN HEMT, with direct low inductance interconnections and effective heat management. This arrangement addresses issues with series inductance and resistance, and thermal resistance.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A system comprising a cascode arrangement of a normally-on depletion mode high voltage GaN FET driven by a normally-off driver MOSFET, and a driver circuit;
   wherein the GaN FET is fabricated on a first substrate die (GaN die) and the driver circuit comprises a CMOS driver circuit fabricated on a second substrate die (CMOS die), the driver MOSFET being integrated with the driver circuit;
   the GaN die comprising an arrangement of a plurality of front-side contacts providing source and gate contacts of the GaN FET;
   the CMOS die comprising a corresponding arrangement of a plurality of front-side contacts providing drain and gate contacts of the driver MOSFET;
   the first and second substrate die being stacked, in a flip-chip configuration, with the respective front-side contacts of each die being directly interconnected by a plurality of conductive interconnects connecting the GaN FET and driver MOSFET in cascode configuration, and
   the CMOS die comprising a plurality of Through Silicon Vias connecting the source of the driver MOSFET to a back-side source electrode of the CMOS die.

2. The system of claim 1 wherein the GaN die comprises a plurality of Through Substrate Vias connecting the drain of the GaN FET to a back-side drain electrode of the GaN die.

3. A system according to claim 1, wherein the respective arrangements of front-side contacts areas of the CMOS die and the GaN die are matched to provide for direct interconnection of respective contact areas by conductive posts.

4. A system according to claim 1 wherein the GaN FET comprises a normally-on GaN HEMT.

5. The system of claim 1 wherein the driver MOSFET comprises a lateral NMOSFET.

6. The system of claim 1 wherein the GaN FET is fabricated comprising island topology.

7. The system of claim 1 wherein the driver MOSFET is fabricated comprising island topology.

8. A system according to claim 2, wherein the respective arrangements of front-side contacts areas of the CMOS die and the GaN die are matched to provide for direct interconnection of respective contact areas by conductive posts.

9. The system of claim 2, further comprising packaging elements for electrical connections and thermal management, wherein the packaging elements comprise a first lead frame and heat spreader in thermal contact with the back-side source electrode of the CMOS die and a second lead frame and heat spreader in thermal contact with the back-side drain electrode of the GaN die.

10. A system according to claim 3 wherein the conductive posts comprise copper posts.

11. The system of claim 9 wherein the first and second heat spreaders are configured to dissipate greater than 50%, and preferably >90%, of heat produced by the system through the second heat spreader on the back-side of the GaN die.

12. The system of claim 9 wherein the packaging elements comprise elements of a PQFN package.

13. A system comprising a cascode arrangement of a normally-on depletion mode high voltage GaN FET driven by a normally-off driver MOSFET, and a driver circuit;
wherein the GaN FET is fabricated on a first substrate die (GaN die) and the driver circuit comprises a CMOS driver circuit fabricated on a second substrate die (CMOS die), the driver MOSFET being integrated with the driver circuit;
the GaN die comprising an arrangement of a plurality of front-side contacts providing source and gate contacts of the GaN FET;
the CMOS die comprising a corresponding arrangement of a plurality of front-side contacts providing drain and gate contacts of the driver MOSFET;
the first and second substrate die being stacked, in a flip-chip configuration, with the respective front-side contacts of each die being directly interconnected by a plurality of conductive interconnects connecting the GaN FET and driver MOSFET in cascode configuration, and
wherein the conductive interconnects comprise metal posts and the metal posts have sufficient height and compliance (ductility) to act as compliant spacers between the GaN die and the CMOS die to accommodate differential thermal expansion of the GaN die and CMOS die during operation.

14. The system of claim 13 wherein ratio of the height of the posts to the diameter of the posts is greater than 1:1 and preferably greater than 2:1.

15. A system comprising a cascode arrangement of a normally-on depletion mode high voltage GaN FET driven by a normally-off driver MOSFET, and a driver circuit;
wherein the GaN FET is fabricated on a first substrate die (GaN die) and the driver circuit comprises a CMOS driver circuit fabricated on a second substrate die (CMOS die), the driver MOSFET being integrated with the driver circuit;
the GaN die comprising an arrangement of a plurality of front-side contacts providing source and gate contacts of the GaN FET;
the CMOS die comprising a corresponding arrangement of a plurality of front-side contacts providing drain and gate contacts of the driver MOSFET;
the first and second substrate die being stacked, in a flip-chip configuration, with the respective front-side contacts of each die being directly interconnected by a plurality of conductive interconnects connecting the GaN FET and driver MOSFET in cascode configuration, and
further comprising a third substrate die comprising an interface circuit, the interface circuit providing pre-isolation conditioning and isolation for the driver circuit, and the third substrate die co-packaged with the first substrate die comprising the GaN FET and the second substrate die comprising the CMOS driver circuit and integrated driver MOSFET.

16. A normally-off N channel driver MOSFET for a system comprising a cascode arrangement of a HV normally on GaN transistor, the driver MOSFET comprising:
a lateral N-channel MOSFET fabricated on a silicon substrate (CMOS die), and comprising an array of a plurality of alternating source and drain regions defined on an active region of the silicon substrate, channel regions extending between the source and drain regions, and an interconnect structure comprising respective source, drain and gate contacts, a plurality of Through Substrate Vias (TSV) connecting the source contacts to a back-side source electrode of the CMOS die, and wherein drain and gate contacts of the driver MOSFET comprise an arrangement of a plurality of front-side contact areas of the CMOS die.

17. A driver for a system comprising a cascode arrangement of a HV normally on GaN transistor and a normally-off N-channel driver MOSFET comprising: a CMOS substrate (CMOS die) comprising a CMOS driver circuit and an integrated driver MOSFET, wherein the driver MOSFET comprises:
a lateral N-channel MOSFET fabricated on a silicon substrate (CMOS die) and comprising an array of a plurality of alternating source and drain regions defined on an active region of the silicon substrate, channel regions extending between the source and drain regions, and an interconnect structure comprising respective source, drain and gate contacts, a plurality of Through Substrate Vias (TSV) connecting the source contacts to a back-side source electrode of the CMOS die, and wherein drain and gate contacts of the driver MOSFET comprise an arrangement of a plurality of front-side contact areas of the CMOS die.

\* \* \* \* \*